US010229619B2

(12) United States Patent
Han et al.

(10) Patent No.: US 10,229,619 B2
(45) Date of Patent: Mar. 12, 2019

(54) TEST CIRCUIT, TEST METHOD, DISPLAY PANEL AND DISPLAY APPARATUS (71) Applicants: BOE Technology Group Co., Ltd., Beijing (CN); Ordos Yuansheng Optoelectronics Co., Ltd., Inner Mongolia (CN)

(72) Inventors: Yuebai Han, Beijing (CN); Xinxin Jin, Beijing (CN); Xiaopeng Bai, Beijing (CN); Shanshan Bao, Beijing (CN); Pucha Zhao, Beijing (CN); Jin Zhao, Beijing (CN); Hongwei Gao, Beijing (CN); Mingyang Zhang, Beijing (CN); Tao Yang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 179 days.

(21) Appl. No.: 15/229,310

(22) Filed: Aug. 5, 2016

(65) Prior Publication Data
US 2017/0200404 A1 Jul. 13, 2017

(30) Foreign Application Priority Data

Jan. 11, 2016 (CN) .......................... 2016 1 0016286

(51) Int. Cl.
G09G 3/00 (2006.01)
G09G 3/3225 (2016.01)
(Continued)

(52) U.S. Cl.
CPC ........... *G09G 3/006* (2013.01); *G09G 3/3225* (2013.01); *G09G 3/3266* (2013.01);
(Continued)

(58) Field of Classification Search
CPC ..... G09G 2310/0286; G09G 2320/043; G09G 2320/045; G09G 2320/0626;
(Continued)

(56) References Cited

U.S. PATENT DOCUMENTS 5,053,700 A 10/1991 Parrish
5,590,079 A 12/1996 Lee et al.
(Continued)

FOREIGN PATENT DOCUMENTS

CN 1116710 A 2/1996
CN 1400470 A 3/2003
(Continued)

OTHER PUBLICATIONS

First Office Action, including Search Report, for Chinese Patent Application No. 201610016286.1, dated Jan. 31, 2018, 13 pages.

*Primary Examiner* — Hong Zhou
(74) *Attorney, Agent, or Firm* — Westman, Champlin & Koehler, P.A.

(57) ABSTRACT

Embodiments of the present disclosure provide a test circuit, a test method, a display panel and a display apparatus. Each of the signal input terminals may input a plurality of signals in a time division multiplexed manner, and in turn may be controlled by the corresponding switches to form a plurality of signal lines, a signal flow of the plurality of signal lines are totally different from each other under control of the switches. For example, one of the signal lines may function as a signal input line, and the other one of the signal lines may function as a signal input line for other specific testing, such as aging process so as to input signals different from the normal turn-on state signals. Consequently, by controlling the corresponding switches through the control signal terminals so that different input signals pass through different signal lines into the display panel to meet testing requirements of normal turn-on state testing, aging process and so
(Continued)

on for the display panel. With respect to the prior art, the testing signals may be input without passing through a shift register unit, which avoids damage of a specific testing signal such as aging signal on the shift register unit and ensure a normal displaying function of the display panel.

9 Claims, 8 Drawing Sheets

(51) Int. Cl.
*G09G 3/3266* (2016.01)
*H01L 51/00* (2006.01)
*H01L 27/32* (2006.01)

(52) U.S. Cl.
CPC . *H01L 51/0031* (2013.01); *G09G 2310/0286* (2013.01); *G09G 2320/043* (2013.01); *G09G 2320/045* (2013.01); *G09G 2320/0626* (2013.01); *G09G 2330/12* (2013.01); *H01L 27/3244* (2013.01); *H01L 2251/562* (2013.01)

(58) Field of Classification Search
CPC .. G09G 2330/12; G09G 3/006; G09G 3/3225; G09G 3/3266; H01L 2251/562; H01L 27/3244; H01L 51/0031
See application file for complete search history.

(56) References Cited

U.S. PATENT DOCUMENTS

| | | | |
|---|---|---|---|
| 5,608,335 A | 3/1997 | Tailliet | |
| 6,067,067 A | 5/2000 | Park | |
| 7,605,599 B2 | 10/2009 | Kwak et al. | |
| 2001/0030635 A1 | 10/2001 | Kodate et al. | |
| 2007/0046581 A1* | 3/2007 | Kwak | G09G 3/006 345/68 |
| 2011/0050660 A1* | 3/2011 | Kim | G09G 3/006 345/205 |
| 2013/0155033 A1* | 6/2013 | Jin | G09G 3/3266 345/204 |
| 2014/0197744 A1* | 7/2014 | Choi | H05B 33/0896 315/130 |
| 2014/0354286 A1* | 12/2014 | Kim | G09G 3/006 324/414 |
| 2015/0090961 A1* | 4/2015 | Lee | H01L 22/30 257/40 |
| 2015/0339959 A1* | 11/2015 | Li | G09G 3/006 324/760.01 |
| 2016/0055829 A1* | 2/2016 | Lin | G09G 3/3233 345/213 |

FOREIGN PATENT DOCUMENTS

| | | |
|---|---|---|
| CN | 1924963 A | 3/2007 |
| JP | 2000-200053 A | 7/2000 |

* cited by examiner

TEST CIRCUIT, TEST METHOD, DISPLAY PANEL AND DISPLAY APPARATUS

CROSS-REFERENCE TO RELATED APPLICATION

This application claims the benefit of Chinese Patent Application No. 201610016286.1, filed on Jan. 11, 2016 in the State Intellectual Property Office of China, the whole disclosure of which is incorporated herein by reference.

TECHNICAL FIELD

The present disclosure relates to display field, and especially to a test circuit, a test method, a display panel and a display apparatus.

BACKGROUND

An organic light emitting diode (OLED) becomes a glaring product for display due to its characteristics of self-illumination, high brightness, wide visual angle, rapid response time, ultra-light, ultra-thin, flexible and so on. A process flow for a display device of a main active matrix organic light emitting diode (AMOLED) is more complex than that of liquid crystal display, and a complex circuit internal to the display device of AMOLED leads to much more un-desirable characteristics. There is a larger leakage current in transistors without aging during the process of an array substrate, which is easy to display a bright point defect in a black frame when it is detected in a normal turning-on state and seriously affect yield of products. At present, a current solution in the industry is to implement aging on the AMOLED display panel, i.e. relevant switch transistors in pixel circuits of the display panel are aged. Such a process may greatly weaken leakage current of the transistor at a voltage of gate-off state so as to eliminate phenomena of bright point defect and a light leakage generated by a higher leakage current of the transistor in a displaying region. However, signals applied during the process of ageing are distinctly different from signals applied for detection in a normal turning-on state or signals during a normal use state. In general, the signals for ageing the transistors have characteristics of higher voltage and opposite directions.

The process for aging transistors is mainly performed for transistors in the display region. However, since a gate scanning and driving mode of the display panel is limited, the signal for aging has to be input to a shift register unit, and is internally converted by the shift register unit into a set of aging signals to the displaying regions. During such a process, the high voltage and opposite direction of the aging signal lead to damage of the shift register unit, even incapable of normal operation, which in turn leads to a series of issues of abnormal displaying of the display panel. Meanwhile, since output signals of the shift register unit are limited and it is impossible to output an effective aging signal, it can't effectively accomplish aging of the transistors.

Thus, an urgent issue for those skilled in the art to solve is how to internally input detection signal and aging signal to the display panel without passing through the shift register unit to implement a process of normal detection and aging of the display panel, so as to avoid that the aging signal damages the shift register unit to affect normal displaying of the display panel.

SUMMARY

Embodiments of the present disclosure provide a test circuit, a test method, a display panel and a display apparatus so as to solve the issue in which when the transistors in the display regions of the display panel is aged, the aging signal has to be output by being converted through the shift register unit so that the aging signal damages the shift register unit to affect normal displaying of the display panel.

The embodiment of the present disclosure provides a test circuit comprising a plurality of signal input terminals, a plurality of control signal terminal and a plurality of switches, wherein each of the control signal terminals corresponds to the plurality of switches and each of the signal input terminals corresponds to the plurality of switches; the control terminals of the respective switches are connected to the corresponding control signal terminals, and the input terminals of the respective switches are connected to the corresponding signal input terminals, and the respective switches are configured to output signals input at the corresponding signal input terminals through output terminals of the switches under control of the signals of the corresponding control signal terminals.

In one alternative embodiment, in the test circuit according to the embodiment of the present disclosure, the switch particularly comprises a switch transistor, a gate of which is connected to a corresponding control signal terminal, a source of which is connected to a corresponding signal input terminal, and a drain of which is configured to output a signal input by the corresponding signal input terminal.

In one alternative embodiment, in the test circuit according to the embodiment of the present disclosure, the test circuit particularly comprises three signal input terminals, three control signal terminals and nine switch transistors, wherein each of the control signal terminals corresponds to the three switch transistors, and each of the signal input terminals corresponds to the three switch transistors; a gate of the respective switch transistor is connected to the corresponding control signal terminal, a source of the respective switch transistor is connected to the corresponding signal input terminal, and a drain of the respective switch transistor is configured to output a signal input by the corresponding signal input terminal.

In one alternative embodiment, in the test circuit according to the embodiment of the present disclosure, the test circuit particularly comprises three signal input terminals, two control signal terminals and six switch transistors, wherein each of the control signal terminals corresponds to the three switch transistors, and each of the signal input terminals corresponds to the two switch transistors; a gate of the respective switch transistor is connected to the corresponding control signal terminal, a source of the respective switch transistor is connected to the corresponding signal input terminal, and a drain of the respective switch transistor is configured to output a signal input by the corresponding signal input terminal.

In one alternative embodiment, the test circuit according to the embodiment of the present disclosure further comprises: a plurality of scanning signal input terminals, a plurality of light emitting signal input terminals, a plurality of first control switches, a plurality of second control switches, a plurality of third control switches, a plurality of fourth control switches and a plurality of fifth control switches;

The three signal terminals are the first signal input terminal, the second signal input terminal and the third signal input terminal; the two control signal terminals are the first control signal terminal and the second control signal terminal; each of the signal input terminals corresponds to one first switch transistor and one second switch transistor; a gate of the first switch transistor is connected to the first control signal terminal, a source of the first switch transistor is connected to the corresponding signal input terminal, and a drain of the first switch transistor is configured to output a signal input by the corresponding signal input terminal; a gate of the second switch transistor is connected to the second control signal terminal, a source of the second switch transistor is connected to the corresponding signal input terminal, and a drain of the second switch transistor is configured to output a signal input by the corresponding signal input terminal;

Each of the scanning signal input terminals corresponds to the two first control switches, and each of the light emitting signal input terminals corresponds to one second control switch;

A control terminal of the respective first control switches is connected to the first control signal terminal; an input terminal of the respective first control switches is connected to the corresponding scanning signal input terminals; the respective first control switches are configured to output a signal input by the corresponding scanning signal input terminals through its output terminal under control of a signal at the first control signal terminal;

A control terminal of the respective second control switches is connected to the first control signal terminal; an input terminal of the respective second control switches is connected to the corresponding light emitting signal input terminals; the respective second control switches are configured to output a signal input by the corresponding light emitting signal input terminals through its output terminal under control of a signal at the first control signal terminal;

A control terminal of the respective third control switches is connected to the second control signal terminal; an input terminal of the respective third control switches is connected to a drain of the second switch transistor corroding to the first signal input terminal; the respective third control switches are configured to output a signal input by the corresponding first signal input terminals through its output terminal under control of a signal at the second control signal terminal;

A control terminal of the respective fourth control switches is connected to the second control signal terminal; an input terminal of the respective fourth control switches is connected to a drain of the second switch transistor corroding to the second signal input terminal; the respective fourth control switches are configured to output a signal input by the corresponding second signal input terminals through its output terminal under control of a signal at the second control signal terminal;

A control terminal of the respective fifth control switches is connected to the second control signal terminal; an input terminal of the respective fifth control switches is connected to a drain of the second switch transistor corroding to the third signal input terminal; the respective fifth control switches are configured to output a signal input by the corresponding third signal input terminals through its output terminal under control of a signal at the second control signal terminal.

In one alternative embodiment, in the test circuit according to the embodiment of the present disclosure, the first control switch particularly comprises a third switch transistor, a gate of which is connected to the first control signal terminal, a source of which is connected to a corresponding scanning signal input terminal, and a drain of which is connected to the corresponding scanning signal input terminals and is configured to output a signal input by the corresponding scanning signal input terminal.

In one alternative embodiment, in the test circuit according to the embodiment of the present disclosure, the second control switch particularly comprises a fourth switch transistor, a gate of which is connected to the first control signal terminal, a source of which is connected to a corresponding light emitting signal input terminal, and a drain of which is configured to output a signal input by the corresponding light emitting signal input terminal.

In one alternative embodiment, in the test circuit according to the embodiment of the present disclosure, the third control switch particularly comprises a fifth switch transistor, a gate of which is connected to the second control signal terminal, a source of which is connected to a drain of the second switch transistor corresponding to a first signal input terminal, and a drain of which is configured to output a signal input by the first signal input terminal.

In one alternative embodiment, in the test circuit according to the embodiment of the present disclosure, the fourth control switch particularly comprises a sixth switch transistor, a gate of which is connected to the second control signal terminal, a source of which is connected to a drain of the second switch transistor corresponding to a second signal input terminal, and a drain of which is configured to output a signal input by the second signal input terminal.

In one alternative embodiment, in the test circuit according to the embodiment of the present disclosure, the fifth control switch particularly comprises a seventh switch transistor, a gate of which is connected to the second control signal terminal, a source of which is connected to a drain of the second switch transistor corresponding to a third signal input terminal, and a drain of which is configured to output a signal input by the third signal input terminal.

An embodiment of the present disclosure provides a test method of the test circuit as mentioned above. The method comprises steps of: when a turn-on signal is input through respective control signal terminals in a time division multiplexed manner, a plurality of switches corresponding to the respective control signal terminals are turned on under control of a signal at the corresponding control signal terminals; and the respective turned-on switches outputs signals input by the corresponding signal input terminals through its output terminal.

In one alternative embodiment, in the test method according to the embodiment of the present disclosure, the step of that when a turn-on signal is input through respective control signal terminals in a time division multiplexed manner, a plurality of switches corresponding to the respective control signal terminals are turned on under control of a signal at the corresponding control signal terminals particularly comprises steps of: when the turn-on signal is input at the first control signal terminal, the plurality of the first switch transistors, the plurality of the third switch transistors and the plurality of the fourth switch transistors are turned on under control of the signal at the first control signal terminal; and when the turn-on signal is input at the second control signal terminal, the plurality of the second switch transistors, the plurality of the fifth switch transistors, the plurality of the sixth switch transistors and the plurality of seventh switch transistors are turned on under control of the signal at the second control signal terminal.

In one alternative embodiment, in the test method according to the embodiment of the present disclosure, the step of that the respective turned-on switches outputs signals input by the corresponding signal input terminals through its output terminal particularly comprises steps of: when the turn-on signal is input through the first control signal terminal, a set of normal testing signals are input through the first signal input terminal, the second signal input terminal and the third signal input terminal; and when a scanning signal is input through the scanning signal input terminal, a light emitting signal is input through the light emitting signal input terminal; the first switch transistor is configured to output the normal testing signal, the third switch transistor is configured to output the scanning signal, and the fourth switch transistor is configured to output the light emitting signal;

When the turn on signal is input through the second control signal terminal, a set of aging testing signals are input through the first signal input terminal, the second signal input terminal and the third signal input terminal; the aging testing signal input through the first signal input terminal is output to the fifth switch transistor through the corresponding second switch transistor, and the fifth switch transistor is configured to output the aging testing signal input through the first signal input terminal; the aging testing signal input through the second signal input terminal is output to the sixth switch transistor through the corresponding second switch transistor, and the sixth switch transistor is configured to output the aging testing signal input through the second signal input terminal; the aging testing signal input through the third signal input terminal is output to the seventh switch transistor through the corresponding second switch transistor, and the seventh switch transistor is configured to output the aging testing signal input through the third signal input terminal.

An embodiment of the present disclosure provides a display panel, which comprises the test circuit according to the embodiment of the present disclosure as mentioned above; a plurality of first shift register units for inputting scanning signals to displaying regions of the display panel; and a plurality of second shift register units for inputting scanning signals to displaying regions of the display panel; wherein the respective first shift register units are connected to the respective scanning signal input terminals in the test circuit in one-to-one correspondence, and the respective first shift register units are configured to input scanning signals to the respective scanning signal input terminals; the respective second shift register units are connected to the respective light emitting signal input terminals in the test circuit in one-to-one correspondence, and the respective second shift register units are configured to input light emitting signals to the respective light emitting signal input terminals.

An embodiment of the present disclosure provides a display apparatus comprising the display panel according to the embodiment of the present disclosure as mentioned above.

In the test circuit according to the embodiment of the present disclosure, each of the signal input terminals may input a plurality of signals in a time division multiplexed manner, and in turn may be controlled by the corresponding switches to form a plurality of signal lines, a signal flow of the plurality of signal lines are totally different from each other under control of the switches. For example, one of the signal lines may function as a signal input line, and the other one of the signal lines may function as a signal input line for other specific testing, such as aging process so as to input signals different from the normal turn-on state signals. Consequently, by controlling the corresponding switches through the control signal terminals so that different input signals pass through different signal lines into the display panel to meet testing requirements of normal turn-on state testing, aging process and so on for the display panel. With respect to the prior art, the test circuit according to embodiments of the present disclosure inputs signals for testing or ageing of the display panel into display regions of the display panel to implement relevant testing process of the display panel without passing through a shift register unit, which avoids damage of a specific testing signal such as aging signal on the shift register unit and ensure a normal displaying function of the display panel.

DETAILED DESCRIPTION

Particular embodiments of the test circuit, the test method, the display panel and the display apparatus according to the embodiments of the present disclosure will be illustrated in detail in conjunction with the accompany figures.

Figure 1:
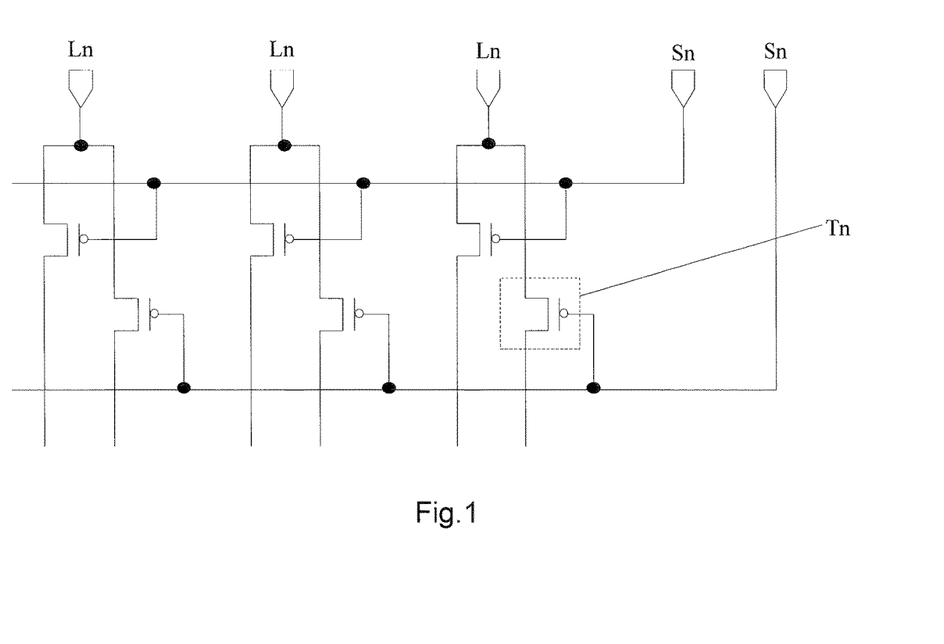
FIG. 1 is a schematic view of configuration of a test circuit according to an embodiment of the present disclosure.

The embodiment of the present disclosure provides a test circuit. As shown in FIG. 1, the test circuit may comprise a plurality of signal input terminals Ln, a plurality of control signal terminal Sn and a plurality of switches Tn. Each of the control signal terminals corresponds to the plurality of switches Tn and each of the signal input terminals corresponds to the plurality of switches Tn; the control terminals of the respective switches Tn are connected to the corresponding control signal terminals Sn, and the input terminals of the respective switches Tn are connected to the corresponding signal input terminals Ln; the respective switches are configured to output signals input at the corresponding signal input terminals Ln through output terminals of the switches under control of the signals of the corresponding control signal terminals Sn.

In the test circuit according to the embodiment of the present disclosure, each of the signal input terminals may input a plurality of signals in a time division multiplexed manner, and in turn may be controlled by the corresponding switches to form a plurality of signal lines, a signal flow of the plurality of signal lines are totally different from each other under control of the switches. For example, one of the signal lines may function as a signal input line, and the other one of the signal lines may function as a signal input line for other specific testing, such as aging process so as to input signals different from the normal turn-on state signals. Consequently, by controlling the corresponding switches through the control signal terminals so that different input signals pass through different signal lines into the display panel to meet testing requirements of normal turn-on state testing, aging process and so on for the display panel. With respect to the prior art, the test circuit according to embodiments of the present disclosure inputs signals for testing or ageing of the display panel into display regions of the display panel to implement relevant testing process of the display panel without passing through a shift register unit, which avoids damage of a specific testing signal such as aging signal on the shift register unit and ensure a normal displaying function of the display panel.

In one particular embodiment, in the test circuit according to the embodiment of the present disclosure, as shown in FIG. 1, the switch particularly comprises a switch transistor, a gate of which is connected to a corresponding control signal terminal, a source of which is connected to a corresponding signal input terminal, and a drain of which is configured to output a signal input by the corresponding signal input terminal. In particular, the respective switch transistors may be turned on under control of signals at the corresponding control signal terminal. That is to say, when a turn-on signal is input to the control signal terminal, the switch transistor which is controlled by such a control signal terminal is in a turn-on state, and in turn output the signal of the corresponding signal input terminal.

Figure 2:
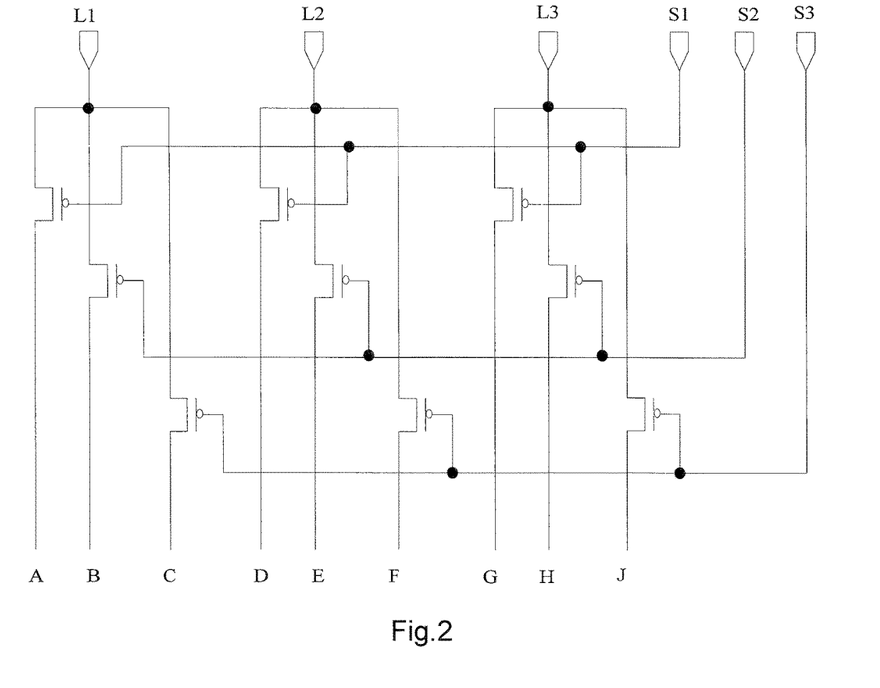
FIG. 2 and FIG. 3 are schematic views of particular configurations of the test circuit according to an embodiment of the present disclosure.

In one particular embodiment, in the test circuit according to the embodiment of the present disclosure, as shown in FIG. 2, the test circuit particularly comprises three signal input terminals, three control signal terminals and nine switch transistors, wherein each of the control signal terminals corresponds to the three switch transistors, and each of the signal input terminals corresponds to the three switch transistors; a gate of the respective switch transistor is connected to the corresponding control signal terminal, a source of the respective switch transistor is connected to the corresponding signal input terminal, and a drain of the respective switch transistor is configured to output a signal input by the corresponding signal input terminal. In particular, as shown in FIG. 2, a P-type transistor is taken as an example of the switch transistor for illustration. When a low level signal is input at the control signal terminal S1 and a high level signal is input at the control signal terminals S2 and S3, the switch transistor which is controlled by the control signal terminal S1 is in a turn-on state, so the respective turned-on switch transistors output a set of signals (A, D, G) input through the signal input terminals L1, L2 and L3; when a high level signal is input at the control signal terminals S1 and S3 and a low level signal is input at the control signal terminal S2, the switch transistor which is controlled by the control signal terminal S2 is in a turn-on state, so the respective turned-on switch transistors output a set of signals (B, E, H) input through the signal input terminals L1, L2 and L3; when a high level signal is input at the control signal terminals S1 and S2 and a low level signal is input at the control signal terminal S3, the switch transistor which is controlled by the control signal terminal S3 is in a turn-on state, so the respective turned-on switch transistors output a set of signals (C, F, G) input through the signal input terminals L1, L2 and L3. Thus, by co-operations of the plurality of control signal terminals, a plurality of sets of signals which are input through the respective signal input terminals in a time division multiplexed manner may be input to the display panel through different signal lines; and one set of input signals may be provided by increasing one control signal terminal. In a particular embodiment, the numbers of the input signal terminals and the control signal terminals may be set according to actual requirements without limitations.

Figure 3:
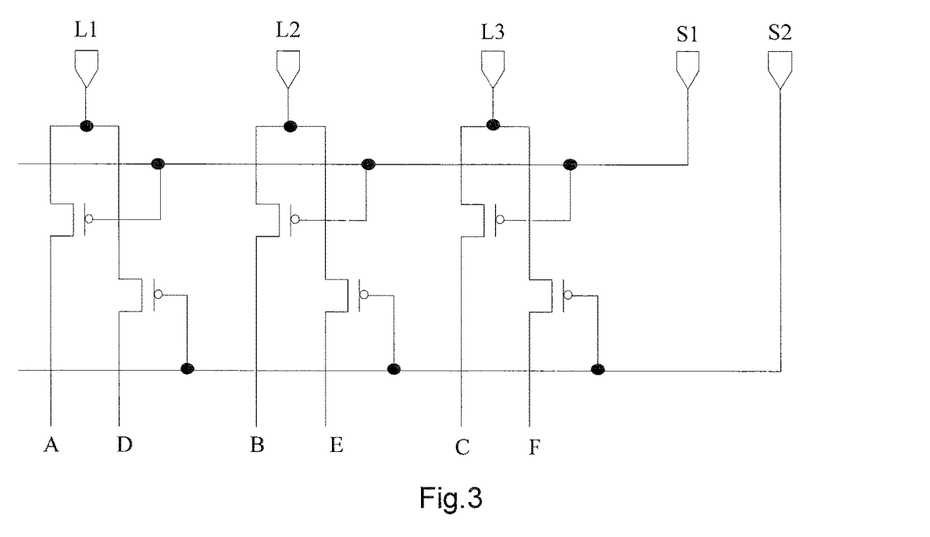

In one particular embodiment, in the test circuit according to the embodiment of the present disclosure, as shown in FIG. 1, the test circuit particularly comprises three signal input terminals, two control signal terminals and six switch transistors, wherein each of the control signal terminals corresponds to the three switch transistors, and each of the signal input terminals corresponds to the two switch transistors; a gate of the respective switch transistor is connected to the corresponding control signal terminal, a source of the respective switch transistor is connected to the corresponding signal input terminal, and a drain of the respective switch transistor is configured to output a signal input by the corresponding signal input terminal. As shown in FIG. 3, a P-type transistor is taken as an example of the switch transistor for illustration. When a low level signal is input at the control signal terminal S1 and a high level signal is input at the control signal terminals S2, the switch transistor which is controlled by the control signal terminal S1 is in a turn-on state, so the respective turned-on switch transistors output a set of signals (A, B, C) input through the signal input terminals L1, L2 and L3; when a high level signal is input at the control signal terminals S1 and a low level signal is input at the control signal terminal S2, the switch transistor which is controlled by the control signal terminal S2 is in a turned-on state, so the respective turned-on switch transistors output a set of signals (D, E, F) input through the signal input terminals L1, L2 and L3.

Figure 5:
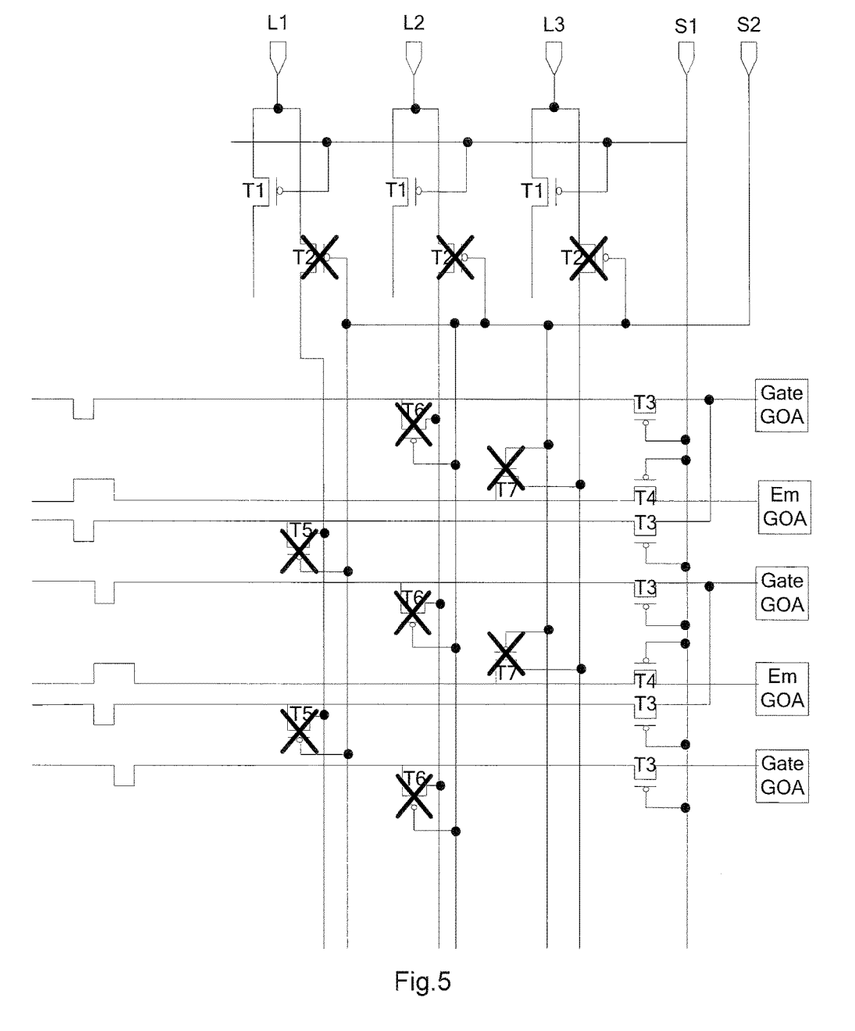
FIG. 5-8 are schematic views of operations of the test circuit for implementing a turn-on testing process and an aging process on the display panel according to an embodiment of the present disclosure.

In one particular embodiment, the test circuit according to the embodiment of the present disclosure as shown in FIG. 5 further comprises: a plurality of scanning signal input terminals Gate, a plurality of light emitting signal input terminals EM, a plurality of first control switches M1, a plurality of second control switches M2, a plurality of third control switches M3, a plurality of fourth control switches M4 and a plurality of fifth control switches M5;

The three signal terminals are the first signal input terminal L1, the second signal input terminal L2 and the third signal input terminal L3; the two control signal terminals are the first control signal terminal S1 and the second control signal terminal S2; each of the signal input terminals corresponds to one first switch transistor T1 and one second switch transistor T2; a gate of the first switch transistor T1 is connected to the first control signal terminal S1, a source of the first switch transistor is connected to the corresponding signal input terminal, and a drain of the first switch transistor is configured to output a signal input by the corresponding signal input terminal; a gate of the second switch transistor T2 is connected to the second control signal terminal S2, a source of the second switch transistor is connected to the corresponding signal input terminal, and a drain of the second switch transistor is configured to output a signal input by the corresponding signal input terminal;

Each of the scanning signal input terminals Gate corresponds to the two first control switches M1, and each of the light emitting signal input terminals EM corresponds to one second control switch;

A control terminal of the respective first control switches M1 is connected to the first control signal terminal S1; an input terminal of the respective first control switches M1 is connected to the corresponding scanning signal input terminals Gate; the respective first control switches M1 are configured to output a signal input by the corresponding scanning signal input terminals Gate through its output terminal under control of a signal at the first control signal terminal S1;

A control terminal of the respective second control switches M2 is connected to the first control signal terminal S1; an input terminal of the respective second control switches M2 is connected to the corresponding light emitting signal input terminals EM; the respective second control switches M2 are configured to output a signal input by the corresponding light emitting signal input terminals EM through its output terminal under control of a signal at the first control signal terminal S1;

A control terminal of the respective third control switches M3 is connected to the second control signal terminal S2; an input terminal of the respective third control switches M3 is connected to a drain of the second switch transistor T2 corroding to the first signal input terminal L1; the respective third control switches M3 are configured to output a signal input by the corresponding first signal input terminals L1 through its output terminal under control of a signal at the second control signal terminal S2;

A control terminal of the respective fourth control switches M4 is connected to the second control signal terminal S2; an input terminal of the respective fourth control switches M4 is connected to a drain of the second switch transistor T2 corroding to the second signal input terminal L2; the respective fourth control switches M4 are configured to output a signal input by the corresponding second signal input terminals L2 through its output terminal under control of a signal at the second control signal terminal S2;

A control terminal of the respective fifth control switches M5 is connected to the second control signal terminal S2; an input terminal of the respective fifth control switches is connected to a drain of the second switch transistor T2 corroding to the third signal input terminal L3; the respective fifth control switches M5 are configured to output a signal input by the corresponding third signal input terminals L3 through its output terminal under control of a signal at the second control signal terminal S2.

The test circuit according to the embodiment of the present disclosure may implement a normal turn-on state testing and an aging process for the display panel.

In particular, when a turn-on signal is input to the first control signal terminal and a non-turn-on signal is input to the second control signal terminal, the first switch transistor corresponding to the three signal input terminals, the first control switch corresponding to the scanning signal input terminal and the second control switch corresponding to the light emitting signal input terminal which are controlled by the first control signal terminal are all in a turned-on state. At this moment, the turned-on first control switch outputs a gate scanning signal input by the corresponding scanning signal input terminal to display regions of the display panel; the turned-on second control switch outputs a light emitting signal input by the corresponding light emitting signal input terminal to display regions of the display panel. At this moment, the first signal input terminal L1, the second signal input terminal L2 and the third signal input terminal L3 input a set of data signals for normally driving the respective pixels of the display panel to emit light so as to implement a normal turn on state testing.

In particular, when a non-turn-on signal is input to the first control signal terminal and a turn-on signal is input to the second control signal terminal, the second switch transistor corresponding to the three signal input terminals, the third control switch, the fourth control switch and the fifth control switch which are controlled by the second control signal terminal are all in a turned-on state. At this moment, the first signal input terminal L1, the second signal input terminal L2 and the third signal input terminal L3 input a set of aging signals for implementing aging on the transistors in the display regions of the display panel. Such aging signals are output to the display regions of the display panel through the turned-on second switch transistor, the third control switch, the fourth control switch and the fifth control switch to implement the aging process of the display panel. Such a set of aging signals do not pass through the shift register units, but are directly output to the display regions of the display panel through the test circuit of the present disclosure, which avoids damage of an aging signal having a high voltage and an opposite directions on the shift register unit.

Figure 4:
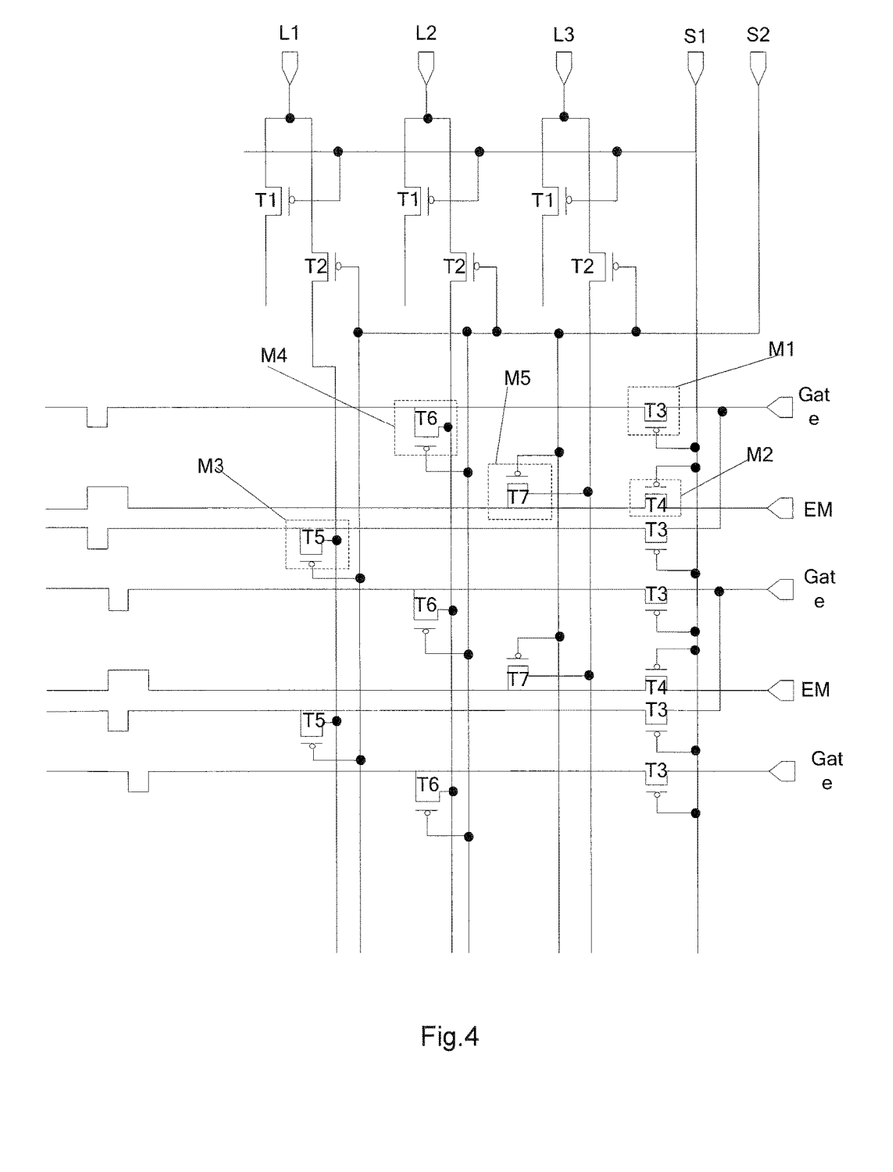
FIG. 4 a schematic view of the test circuit for implementing a turn-on testing process and an aging process on the display panel according to an embodiment of the present disclosure.

In one particular embodiment, in the test circuit according to the embodiment of the present disclosure, as shown in FIG. 4, the first control switch particularly comprises a third switch transistor T3, a gate of which is connected to the first control signal terminal S1, a source of which is connected to a corresponding scanning signal input terminal Gate, and a drain of which is configured to output a signal input by the corresponding scanning signal input terminal Gate. In particular, when a turn-on signal is input to the first control signal terminal, the third switch transistor is in a turned-on state so that the turned-on third switch transistor output the signals input through the corresponding scanning signal input terminal.

In one particular embodiment, in the test circuit according to the embodiment of the present disclosure, as shown in FIG. 4, the second control switch particularly comprises a fourth switch transistor T4, a gate of which is connected to the first control signal terminal S1, a source of which is connected to a corresponding light emitting signal input terminal EM, and a drain of which is configured to output a signal input by the corresponding light emitting signal input terminal. In particular, when a turn-on signal is input to the first control signal terminal, the fourth switch transistor is in a turned-on state so that the turned-on fourth switch transistor output the signals input through the corresponding light emitting signal input terminal.

In one particular embodiment, in the test circuit according to the embodiment of the present disclosure, as shown in FIG. 4, the third control switch particularly comprises a fifth switch transistor T5, a gate of which is connected to the second control signal terminal S2, a source of which is connected to a drain of the second switch transistor T2 corresponding to a first signal input terminal L1, and a drain of which is configured to output a signal input by the first signal input terminal L1. In particular, when a turn-on signal is input to the second control signal terminal, the fifth switch transistor is in a turned-on state so that the turned-on fifth switch transistor output the signals input through the first signal input terminal.

In one particular embodiment, in the test circuit according to the embodiment of the present disclosure, the fourth control switch particularly comprises a sixth switch transistor T6, a gate of which is connected to the second control signal terminal S2, a source of which is connected to a drain of the second switch transistor T2 corresponding to a second signal input terminal L2, and a drain of which is configured to output a signal input by the second signal input terminal L2. In particular, when a turn-on signal is input to the second control signal terminal, the sixth switch transistor is in a turned-on state so that the turned-on sixth switch transistor output the signals input through the second signal input terminal.

In one particular embodiment, in the test circuit according to the embodiment of the present disclosure as shown in FIG. 4, the fifth control switch particularly comprises a seventh switch transistor T7, a gate of which is connected to the second control signal terminal L2, a source of which is connected to a drain of the second switch transistor T2 corresponding to a third signal input terminal L3, and a drain of which is configured to output a signal input by the third signal input terminal L3. In particular, when a turn-on signal is input to the second control signal terminal, the seventh switch transistor is in a turned-on state so that the turned-on seventh switch transistor output the signals input through the third signal input terminal.

On the basis of the same inventive idea, an embodiment of the present disclosure provides a test method of the test circuit as mentioned above. The method particularly comprises steps of: when a turn-on signal is input through respective control signal terminals in a time division multiplexed manner, a plurality of switches corresponding to the respective control signal terminals are turned on under control of a signal at the corresponding control signal terminals; and the respective turned-on switches outputs signals input by the corresponding signal input terminals through its output terminal.

In the test method according to the embodiment of the present disclosure, each of the signal input terminals may input a plurality of signals in a time division multiplexed manner, and in turn may be controlled by the corresponding switches to form a plurality of signal lines, a signal flow of the plurality of signal lines are totally different from each other under control of the switches. For example, one of the signal lines may function as a signal input line, and the other one of the signal lines may function as a signal input line for other specific testing, such as aging process so as to input signals different from the normal turn-on state signals. Consequently, by controlling the corresponding switches through the control signal terminals so that different input signals pass through different signal lines into the display panel to meet testing requirements of normal turn-on state testing, aging process and so on for the display panel. With respect to the prior art, the test circuit according to embodiments of the present disclosure inputs signals for testing or ageing of the display panel into display regions of the display panel to implement relevant testing process of the display panel without passing through a shift register unit, which avoids damage of a specific testing signal such as aging signal on the shift register unit and ensure a normal displaying function of the display panel.

In one particular embodiment, in the test method according to the embodiment of the present disclosure, the step of that when a turn-on signal is input through respective control signal terminals in a time division multiplexed manner, a plurality of switches corresponding to the respective control signal terminals are turned on under control of a signal at the corresponding control signal terminals particularly comprises steps of: when the turn-on signal is input at the first control signal terminal, the plurality of the first switch transistors, the plurality of the third switch transistors and the plurality of the fourth switch transistors are turned on under control of the signal at the first control signal terminal; and when the turn-on signal is input at the second control signal terminal, the plurality of the second switch transistors, the plurality of the fifth switch transistors, the plurality of the sixth switch transistors and the plurality of seventh switch transistors are turned on under control of the signal at the second control signal terminal.

In one particular embodiment, in the test method according to the embodiment of the present disclosure, the step of that the respective turned-on switches outputs signals input by the corresponding signal input terminals through its output terminal particularly comprises steps of: when the turn-on signal is input through the first control signal terminal, a set of normal testing signals are input through the first signal input terminal, the second signal input terminal and the third signal input terminal, a scanning signal is input through the scanning signal input terminal, a light emitting signal is input through the light emitting signal input terminal; the first switch transistor is configured to output the normal testing signal, the third switch transistor is configured to output the scanning signal, and the fourth switch transistor is configured to output the light emitting signal;

When the turn on signal is input through the second control signal terminal, a set of aging testing signals are input through the first signal input terminal, the second signal input terminal and the third signal input terminal; the aging testing signal input through the first signal input terminal is output to the fifth switch transistor through the corresponding second switch transistor, and the fifth switch transistor is configured to output the aging testing signal input through the first signal input terminal; the aging testing signal input through the second signal input terminal is output to the sixth switch transistor through the corresponding second switch transistor, and the sixth switch transistor is configured to output the aging testing signal input through the second signal input terminal; the aging testing signal input through the third signal input terminal is output to the seventh switch transistor through the corresponding second switch transistor, and the seventh switch transistor is configured to output the aging testing signal input through the third signal input terminal.

In particular, in the test method according to the embodiment of the present disclosure, the respective switch transistors may be turned on under control of the signal at the corresponding control signal terminals, and in turn output the signals input through the corresponding signal input terminals to implement the relevant testing process of the display panel.

On the basis of the same inventive idea, an embodiment of the present disclosure provides a display panel, which particularly comprises the test circuit according to the embodiment of the present disclosure as mentioned above; a plurality of first shift register units for inputting scanning signals to displaying regions of the display panel; and a plurality of second shift register units for inputting scanning signals to displaying regions of the display panel; wherein the respective first shift register units are connected to the respective scanning signal input terminals in the test circuit in one-to-one correspondence, and the respective first shift register units are configured to input scanning signals to the respective scanning signal input terminals; the respective second shift register units are connected to the respective light emitting signal input terminals in the test circuit in one-to-one correspondence, and the respective second shift register units are configured to input light emitting signals to the respective light emitting signal input terminals.

In particular, one particular embodiment will be illustrated in detail in the following to describe a particular process of the normal turn-on state testing and aging process on the display panel by the test method according to the embodiment of the present disclosure.

When a normal turn-on state testing is implemented on the display panel, as shown in FIG. 5, the respective switch transistors are illustrated by taking a P-type transistor as an example. At this moment, the first shift register unit GateGOA normally outputs a scanning signal to the display panel, the second shift register unit EmGOA normally outputs a light emitting signal to the display panel, and a set of data signals for normally driving the respective pixels in the display panel to emit light are input through the first signal input terminal L1, the second signal input terminal L2 and the third signal input terminal L3. A low level signal is input at the first control signal terminal S1 and a high level signal is input at the second control signal terminal S2. Thus, as shown in FIG. 5, the respective second switch transistor T2, the fifth switch transistor T5, the sixth switch transistor T6 and the seventh switch transistor T7 are in a turn-off state; the respective first switch transistor T1, the third switch transistor T3 and the fourth switch transistor T4 are in a turn-on state. The turned-on third switch transistor T3 output the scanning signal output by the first shift register unit GateGOA to the display regions of the display panel. The turned-on fourth switch transistor T4 output the light emitting signal output by the second shift register unit EmGOA to the display regions of the display panel. The turned-on first switch transistor T1 outputs the set of data signal for normally driving the respective pixels of the display panel to emit light input by the first signal input terminal L1, the second signal input terminal L3 and the third signal input terminal L3 to the display regions of the display panel. Then, the display panel may implement a normal turn-on state testing. At this moment, FIG. 5 may be simplified as FIG. 6 which definitely shows schematic view of the display regions of the display panel to which the scanning signals, light emitting signals and data signals for implementing the normal turn-on state testing of the display panel are input.

Figure 6:
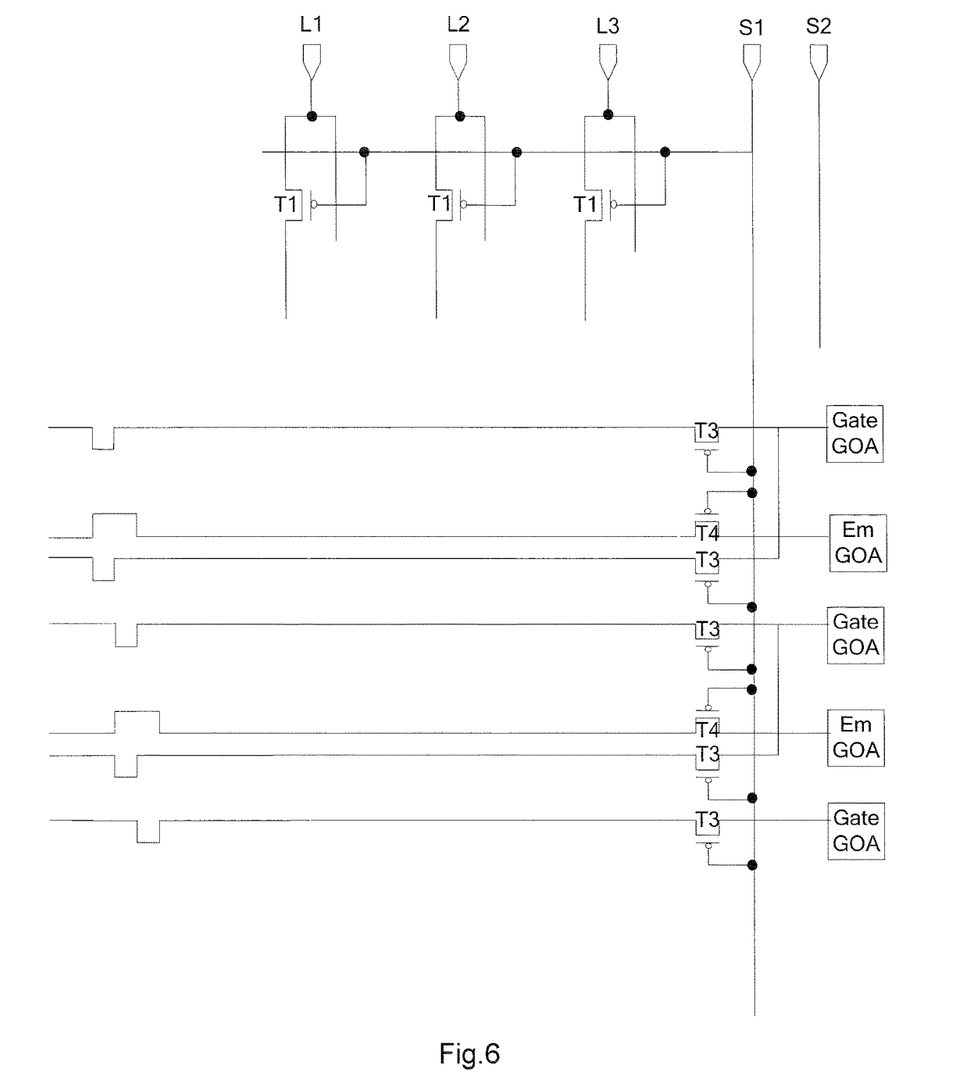
Figure 7:
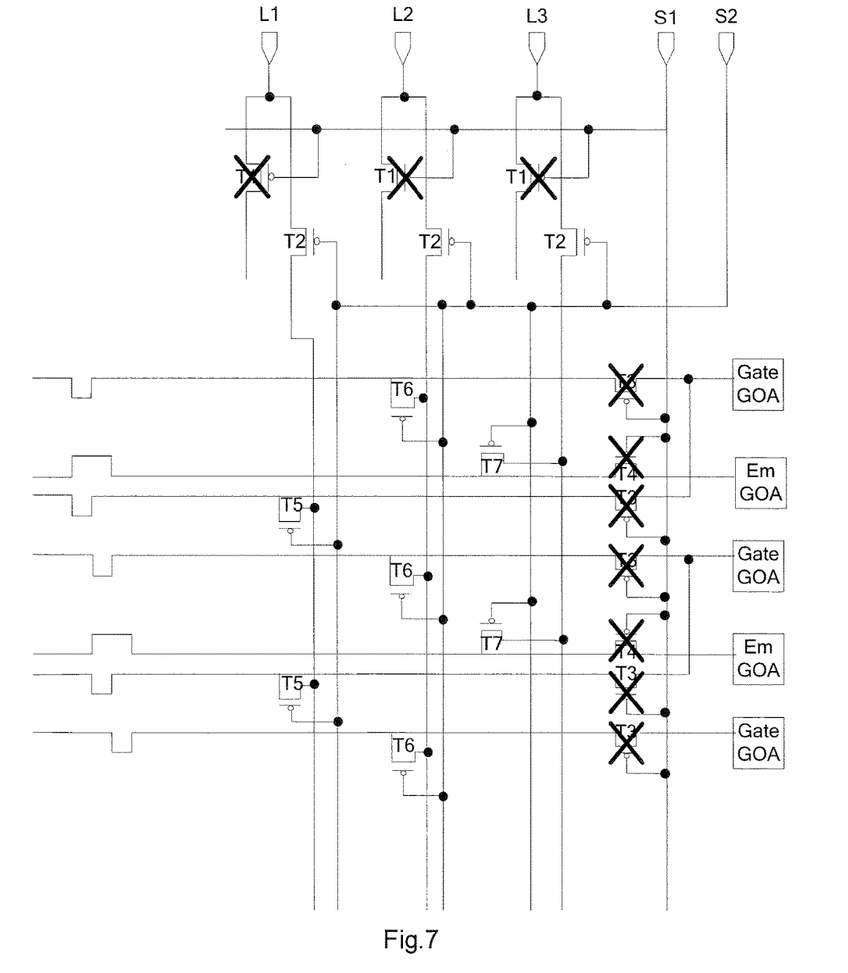

When an aging process is implemented on the display panel, as shown in FIG. 7, the respective switch transistors are illustrated by taking a P-type transistor as an example. At this moment, a set of signals for aging the transistors in the display regions of the display panel are input through the first signal input terminal L1, a high level signal is input at the first control signal terminal S1, and a low level signal is input at the second control signal terminal S2. Thus, as shown in FIG. 6, the respective second switch transistor T2, the fifth switch transistor T5, the sixth switch transistor T6 and the seventh switch transistor T7 are in a turn-on state; the respective first switch transistor T1, the third switch transistor T3 and the fourth switch transistor T4 are in a turn-off state. The turned-on second switch transistor T2 output the aging signal input by the first signal input terminal L1, the second signal input terminal L2 and the third signal input terminal L3 to the fifth switch transistor T5, the sixth switch transistor T6 and the seventh switch transistor T7. Then, the turned on fifth switch transistor T5, the sixth switch transistor T6 and the seventh switch transistor T7 output these signals to the display regions of the display panel so as to implement the aging process on the transistors in the display regions of the display panel.

Figure 8:
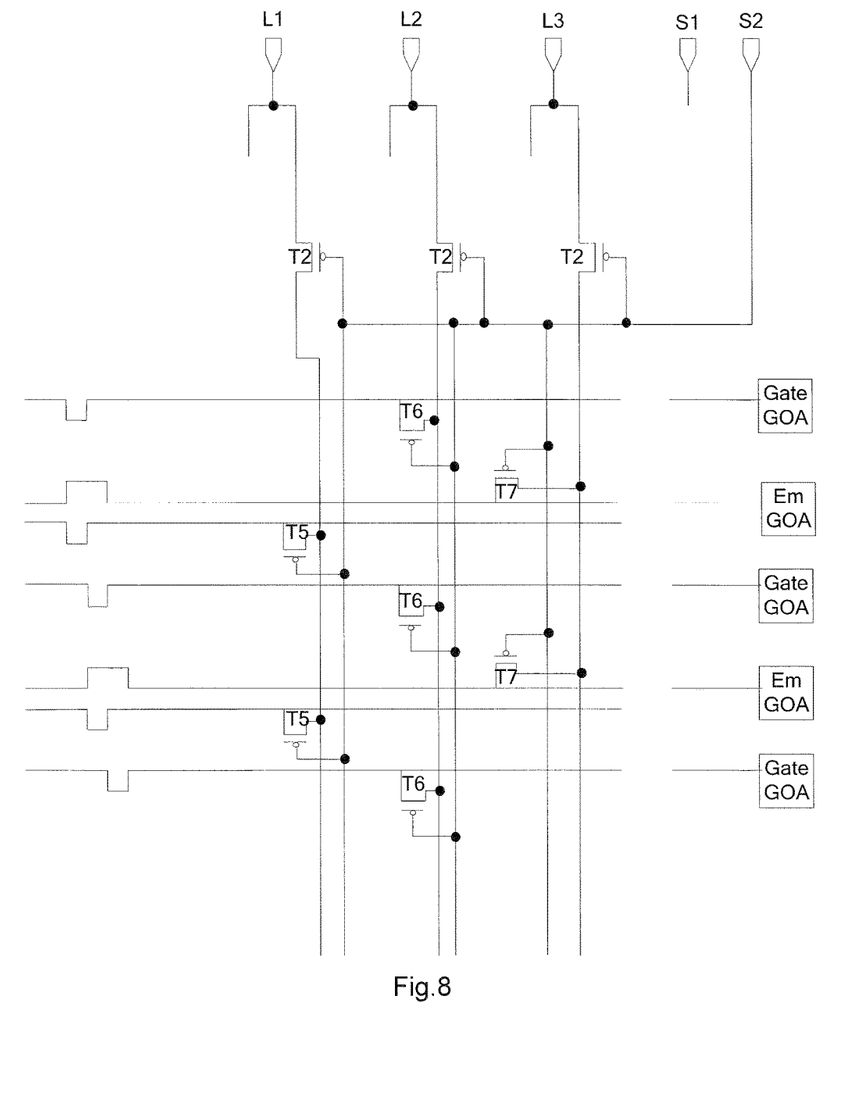

At this moment, FIG. 7 may be simplified as FIG. 8 which definitely shows schematic view of the display regions of the display panel to which the aging signals for implementing the aging process of the display panel are input. FIG. 8 also definitely shows that since the high level signal is input at the first control signal terminal S1, the respective first switch transistor T1, third switch transistor T3a and fourth switch transistor T4 are in a turn-off state, so that the first shift register unit GateGOA and the second shift register unit EmGOA are disconnected from the terminals for inputting signals to the display regions so as to disconnect the shift register unit from a signal line of the display regions. Consequently, the signals for the aging process are directly input to the display regions of the display panel without passing through the shift register unit, which avoids damage of the aging signal on the shift register unit and facilitates an effective and direct aging process of the display panel.

On the basis of the same inventive idea, an embodiment of the present disclosure provides a display apparatus comprising the display panel according to the embodiment o the present disclosure. The display apparatus may be applied to any products or components having a display function, such as a mobile phone, tablet computer, television, display device, notebook, digital photo frame, navigator and the like. Since the principle of such a display apparatus is similar to that of the display panel, the particular implementation of the display apparatus may be referred to that of the display panel and is omitted for brevity.

The embodiment of the present disclosure provides a test circuit, a test method, a display panel and a display apparatus. The test circuit comprises a plurality of signal input terminals, a plurality of control signal terminal and a plurality of switches, wherein each of the control signal terminals corresponds to the plurality of switches and each of the signal input terminals corresponds to the plurality of switches; the control terminals of the respective switches are connected to the corresponding control signal terminals, and the input terminals of the respective switches are connected to the corresponding signal input terminals, and the respective switches are configured to output signals input at the corresponding signal input terminals through output terminals of the switches under control of the signals of the corresponding control signal terminals.

In particular, in the test circuit according to the embodiment of the present disclosure, each of the signal input terminals may input a plurality of signals in a time division multiplexed manner, and in turn may be controlled by the corresponding switches to form a plurality of signal lines, a signal flow of the plurality of signal lines are totally different from each other under control of the switches. For example, one of the signal lines may function as a signal input line, and the other one of the signal lines may function as a signal input line for other specific testing, such as aging process so as to input signals different from the normal turn-on state signals. Consequently, by controlling the corresponding switches through the control signal terminals so that different input signals pass through different signal lines into the display panel to meet testing requirements of normal turn-on state testing, aging process and so on for the display panel. With respect to the prior art, the test circuit according to embodiments of the present disclosure inputs signals for testing or ageing of the display panel into display regions of the display panel to implement relevant testing process of the display panel without passing through a shift register unit, which avoids damage of a specific testing signal such as aging signal on the shift register unit and ensure a normal displaying function of the display panel.

It is apparent that those skilled in the art may make various changes and modifications on the present invention without departing from the spirit and scope of the present invention. If these changes and modification fall within the scope of the claims and their equivalents of the present disclosure, the present invention intends to include these changes and modifications.

We claim:

1. A circuit comprising:
a plurality of signal input terminals, a plurality of control signal terminals and a plurality of switches, wherein each of the control signal terminals corresponds to the plurality of switches and each of the signal input terminals corresponds to the plurality of switches;
control terminals of the respective switches are connected to the corresponding control signal terminals, and input terminals of the respective switches are connected to the corresponding signal input terminals, and the respective switches are configured to output signals input at the corresponding signal input terminals through output terminals of the switches under control of the signals of the corresponding control signal terminals, each of the signals input terminals input a plurality of signals in a time division multiplexed manner, and in turn are controlled by the corresponding switches to form a plurality of signal lines, a signal flow of the plurality of signal lines are totally different from each other under control of the switches, wherein the switches particularly comprises a plurality of switch transistors, a gate of the respective switch transistors is connected to a corresponding control signal terminal, a source of the respective switch transistors is connected to a corresponding signal input terminal, and a drain of the respective switch transistors is configured to output a signal input by the corresponding signal input terminal, wherein the test circuit particularly comprises three signal input terminals, two control signal terminals and six switch transistors, wherein each of the control signal terminals corresponds to three switch transistors, and each of the signal input terminals corresponds to two switch transistors;

a gate of the respective switch transistors is connected to the corresponding control signal terminal, a source of the respective switch transistors is connected to the corresponding signal input terminal, and a drain of the respective switch transistors is configured to output a signal input by the corresponding signal input terminal, wherein the test circuit further comprising:

a plurality of scanning signal input terminals, a plurality of light emitting signal input terminals, a plurality of first control switches, a plurality of second control switches, a plurality of third control switches, a plurality of fourth control switches and a plurality of fifth control switches; three signal terminals are a first signal input terminal, a second signal input terminal and a third signal input terminal; two control signal terminals are a first control signal terminal and a second control signal terminal; each of the signal input terminals corresponds to a first switch transistor and a second switch transistor; a gate of the first switch transistor is connected to the first control signal terminal, a source of the first switch transistor is connected to the corresponding signal input terminal, and a drain of the first switch transistor is configured to output a signal input by the corresponding signal input terminal; a gate of the second switch transistor is connected to the second control signal terminal, a source of the second switch transistor is connected to the corresponding signal input terminal, and a drain of the second switch transistor is configured to output a signal input by the corresponding signal input terminal; each of the scanning signal input terminals corresponds to two first control switches, and each of the light emitting signal input terminals corresponds to one second control switch;

a control terminal of the respective first control switches is connected to the first control signal terminal; an input terminal of the respective first control switches is connected to the corresponding scanning signal input terminals; the respective first control switches are configured to output a signal input by the corresponding scanning signal input terminals through its output terminal under control of a signal at the first control signal terminal;

a control terminal of the respective second control switches is connected to the first control signal terminal; an input terminal of the respective second control switches is connected to the corresponding light emitting signal input terminals; the respective second control switches are configured to output a signal input by the corresponding light emitting signal input terminals through its output terminal under control of a signal at the first control signal terminal;

a control terminal of the respective third control switches is connected to the second control signal terminal; an input terminal of the respective third control switches is connected to a drain of the second switch transistor corroding to the first signal input terminal; the respective third control switches are configured to output a signal input by the corresponding first signal input terminals through its output terminal under control of a signal at the second control signal terminal;

a control terminal of the respective fourth control switches is connected to the second control signal terminal; an input terminal of the respective fourth control switches is connected to a drain of the second switch transistor corroding to the second signal input terminal; the respective fourth control switches are configured to output a signal input by the corresponding second signal input terminals through its output terminal under control of a signal at the second control signal terminal;

a control terminal of the respective fifth control switches is connected to the second control signal terminal; an input terminal of the respective fifth control switches is connected to a drain of the second switch transistor corroding to the third signal input terminal; the respective fifth control switches are configured to output a signal input by the corresponding third signal input terminals through its output terminal under control of a signal at the second control signal terminal.

2. The test circuit according to claim 1, wherein the first control switches particularly comprise a third switch transistor, a gate of which is connected to the first control signal terminal, a source of which is connected to a corresponding scanning signal input terminal, and a drain of which is connected to the corresponding scanning signal input terminals and is configured to output a signal input by the corresponding scanning signal input terminal.

3. The test circuit according to claim 1, wherein the second control switches particularly comprise a fourth switch transistor, a gate of which is connected to the first control signal terminal, a source of which is connected to a corresponding light emitting signal input terminal, and a drain of which is configured to output a signal input by the corresponding light emitting signal input terminal.

4. The test circuit according to claim 1, wherein the third control switches particularly comprise a fifth switch transistor, a gate of which is connected to the second control signal terminal, a source of which is connected to a drain of the second switch transistor corresponding to a first signal input terminal, and a drain of which is configured to output a signal input by the first signal input terminal.

5. The test circuit according to claim 1, wherein the fourth control switches particularly comprise a sixth switch transistor, a gate of which is connected to the second control signal terminal, a source of which is connected to a drain of the second switch transistor corresponding to a second signal input terminal, and a drain of which is configured to output a signal input by the second signal input terminal.

6. The test circuit according to claim 1, wherein the fifth control switches particularly comprise a seventh switch transistor, a gate of which is connected to the second control signal terminal, a source of which is connected to a drain of the second switch transistor corresponding to a third signal input terminal, and a drain of which is configured to output a signal input by the third signal input terminal.

7. A test method of the test circuit according to claim 1, the method comprises steps of:
when a turn-on signal is input through respective control signal terminals in a time division multiplexed manner, a plurality of switches corresponding to the respective control signal terminals are turned on under control of a signal at the corresponding control signal terminals; and
the respective turned-on switches outputs signals input by the corresponding signal input terminals through its output terminal,
wherein the step of that when a turn-on signal is input through respective control signal terminals in a time division multiplexed manner, a plurality of switches corresponding the respective control signal terminals are turned on under control of a signal at the corresponding control signal terminals particularly comprises steps of:
when the turn-on signal is input at a first control signal terminal, a plurality of the first switch transistors, a plurality of the third switch transistors and a plurality of the fourth switch transistors are turned on under control at the signal at the first control signal terminal; and
when the turn-on signal is input at a second control signal terminal, a plurality of the second switch transistors, a plurality of the fifth switch transistors, a plurality of the sixth switch transistors and the plurality of seventh switch transistors are turned on under control of the signal at the second control signal terminal,
wherein the step of that the respective turned-on switches outputs signals input by the corresponding signal input terminals through its output terminal particularly comprises steps of:
when the turn-on signal is input through a first control signal terminal, a set of normal testing signals are input through a first signal input terminal, a second signal input terminal and a third signal input terminal; and when a scanning signal is input through a scanning signal input terminal, a light emitting signal is input through a light emitting signal input terminal; a first switch transistor is configured to output the normal testing signal, a third switch transistor is configured to output the scanning signal, and a fourth switch transistor is configured to output the light emitting signal;
when the turn on signal is input through a second control signal terminal, a set of aging testing signals are input through the first signal input terminal, the second signal input terminal and the third signal input terminal; the aging testing signal input through the first signal input terminal is output to a fifth switch transistor through the corresponding second switch transistor, and the fifth switch transistor is configured to output the aging testing signal input through the first signal input terminal; the aging testing signal input through the second signal input terminal is output to a sixth switch transistor through the corresponding second switch transistor, and the sixth switch transistor is configured to output the aging testing signal input through the second signal input terminal; the aging testing signal input through the third signal input terminal is output to a seventh switch transistor through the corresponding second switch transistor, and the seventh switch transistor is configured to output the aging testing signal input through the third signal input terminal,
wherein the step of that the respective turned-on switches outputs signals input by the corresponding signal input terminals through its output terminal particularly comprises steps of:
when the turn-on signal is input through a first control signal terminal, a set of normal testing signals are input through a first signal input terminal, a second signal input terminal and a third signal input terminal; and when a scanning signal is input through a scanning signal input terminal, a light emitting signal is input through a light emitting signal input terminal; a first switch transistor is configured to output the normal testing signal, a third switch transistor is configured to output the scanning signal, and a fourth switch transistor is configured to output the light emitting signal;
when the turn on signal is input through a second control signal terminal, a set of aging testing signals are input through the first signal input terminal, the second signal input terminal and the third signal input terminal; the aging testing signal input through the first signal input terminal is output to a fifth switch transistor through the corresponding second switch transistor, and the fifth switch transistor is configured to output the aging testing signal input through the first signal input terminal; the aging testing signal input through the second signal input terminal is output to a sixth switch transistor through the corresponding second switch transistor, and the sixth switch transistor is configured to output the aging testing signal input through the second signal input terminal; the aging testing signal input through the third signal input terminal is output to a seventh switch transistor through the corresponding second switch transistor, and the seventh switch transistor is configured to output the aging testing signal input through the third signal input terminal.

8. A display panel, which comprises the test circuit according to claim 1, a plurality of first shift register units for inputting light emitting signals to displaying regions of the display panel and a plurality of second shift register units for inputting scanning signals to displaying regions of the display panel; wherein
the respective first shift register units are connected to the respective scanning signal input terminals in the test circuit in one-to-one correspondence, and the respective first shift register units are configured to input scanning signals to the respective scanning signal input terminals;
the respective second shift register units are connected to the respective light emitting signal input terminals in the test circuit in one-to-one correspondence, and the respective second shift register units are configured to input light emitting signals to the respective light emitting signal input terminals.

9. A display apparatus comprising the display panel according to claim 8.

\* \* \* \* \*